United States Patent
Onodera

(10) Patent No.: US 7,830,210 B2
(45) Date of Patent: Nov. 9, 2010

(54) AMPLIFIER DEVICE

(75) Inventor: Eio Onodera, Ota (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/581,406

(22) Filed: Oct. 19, 2009

(65) Prior Publication Data
US 2010/0102886 A1    Apr. 29, 2010

(30) Foreign Application Priority Data
Oct. 24, 2008   (JP) .............................. 2008-274503

(51) Int. Cl.
*H03F 3/16*    (2006.01)
(52) U.S. Cl. .................... 330/300; 330/149; 330/278
(58) Field of Classification Search .................. 330/300, 330/149, 278
See application file for complete search history.

(56) References Cited
U.S. PATENT DOCUMENTS

| | | | |
|---|---|---|---|
| 4,037,064 A | * | 7/1977 | Yasuda ........................ 381/26 |
| 4,577,160 A | * | 3/1986 | Lettvin et al. ................ 330/149 |
| 6,888,408 B2 | * | 5/2005 | Furst et al. ................... 330/277 |
| 7,042,228 B2 | * | 5/2006 | Lally et al. ................... 324/527 |
| 7,224,226 B2 | * | 5/2007 | Kojima et al. ................ 330/253 |
| 7,421,254 B2 | * | 9/2008 | Behzad ..................... 455/115.1 |

FOREIGN PATENT DOCUMENTS

| | | |
|---|---|---|
| JP | 5-167358 | 7/1993 |
| JP | 2003-243944 | 8/2003 |

* cited by examiner

*Primary Examiner*—Patricia Nguyen
(74) *Attorney, Agent, or Firm*—Morrison & Foerster LLP

(57) ABSTRACT

Provided is an amplifier device including a J-FET, a bipolar transistor, a first resistor and a second resistor. The amplifier device has a configuration in which a gate of the J-FET is connected to one end of an ECM and one end of the first resistor, a drain of the J-FET is connected to an input terminal of the bipolar transistor, a high-potential side of the bipolar transistor is connected to one end of a load resistor, the other end of the first resistor is grounded, a source of the J-FET and a low-potential side of the bipolar transistor are connected to one end of the second resistor, the other end of the second resistor is grounded, and an output voltage is drawn from the high-potential side of the bipolar transistor.

11 Claims, 8 Drawing Sheets

AMPLIFIER DEVICE

This application claims priority from Japanese Patent Application Number JP 2008-274503 filed on Oct. 24, 2008, the content of which is incorporated herein by reference in its entirety.

BACKGROUND OF THE INVENTION

1. Field of the Invention

The present invention relates to an amplifier device, and particularly to an amplifier device which reduces distortion and allows gain to be designed easily when used for an electret condenser microphone.

2. Description of the Related Art

To perform impedance conversion and amplification of an electret condenser microphone (ECM, below), a junction field effect transistor (J-FET, below) or an amplifier integrated circuit device has been used, for example. This technology is described for instance in Japanese Patent Application Publication Nos. 2003-243944 and Hei 5-167358.

An amplifier integrated circuit device (Japanese Patent Application Publication No. Hei 5-167358, for example) has an advantage in that gain can be appropriately selected according to its circuit constant and a higher gain can generally be achieved than a case of using a J-FET. However, the amplifier integrated circuit device has problems that the circuit configuration is complicated and the cost is high.

Moreover, since noise included in an input is also amplified in the amplifier integrated circuit device, S/N, which is an index of sound quality, does not improve by changing the gain. Furthermore, since noise occurs from both a resistor and a semiconductor, the amplifier integrated circuit device, having a complicated circuit configuration, has more noise sources than a J-FET, having a simple configuration, and consequently has lower S/N in general.

By contrast, a J-FET is known to have a high input impedance, have little low-frequency noise in small-signal amplification, and has excellent high-frequency characteristics. Moreover, the J-FET has a simpler circuit configuration and is less expensive than the above-described amplifier integrated circuit device. Accordingly, the amplifier integrated circuit device is required when high sensitivity is regarded as important, while the J-FET is generally used when the sensitivity of the J-FET is sufficient.

However, when only the J-FET is used, a problem arises that an output is not sufficiently amplified to result in a low gain. Since the microphone sensitivity of the ECM affects the AC component of the output voltage Vout amplified by the amplifier device as described above, a higher gain is more desirable to improve the microphone sensitivity. To increase the gain, an increase in the area of the J-FET (cell size) is effective. However, an increase in the area of the J-FET leads to an increase in an input capacitance Cin of the J-FET. This increases an input loss, leading to a decrease in S/N.

SUMMARY OF THE INVENTION

The invention provides an amplifier device connected between an electret condenser microphone and a load resistor. The amplifier device includes a junction field effect transistor having a gate, a source and a drain, a bipolar transistor having a base, a high-potential side terminal and a low-potential side terminal, a first resistor having a first terminal and a second terminal, and a second resistor having a third terminal and a fourth terminal. The gate is connected to a terminal of the electret condenser microphone and the first terminal, the drain is connected to the base, the high-potential side terminal is connected to a terminal of the load resistor, the second terminal is grounded, the source and the low-potential side terminal are connected to the third terminal, the fourth terminal is grounded, and an output voltage is drawn between the high-potential side terminal and the terminal of the load resistor.

DESCRIPTION OF THE INVENTION

Figure 8:
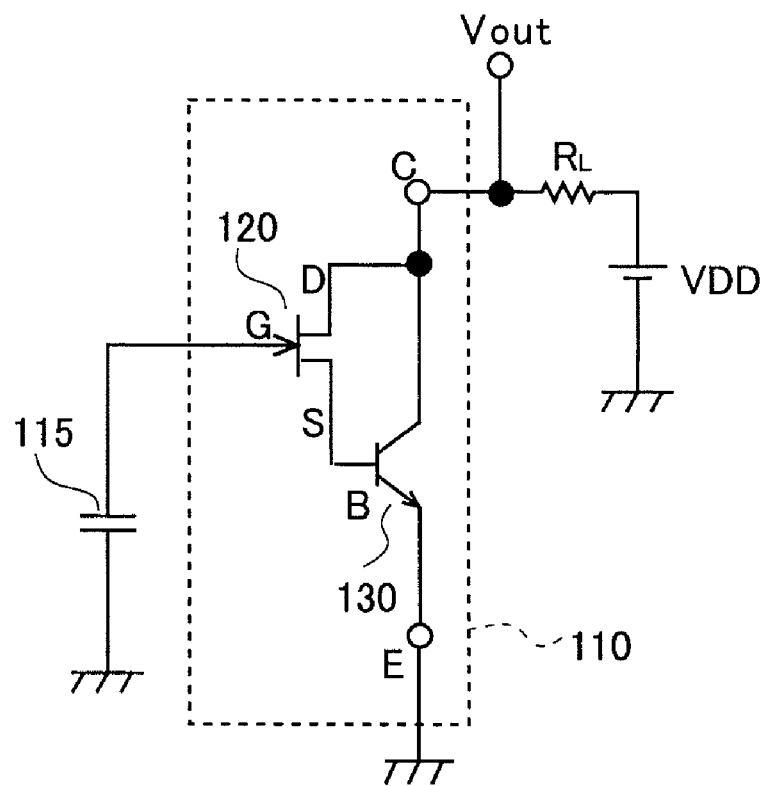
FIG. 8 is a circuit diagram illustrating a amplifier device having a source follower structure.

FIG. 8 is a circuit diagram showing an amplifier device having a source follower structure 110.

The amplifier device having a source follower structure 110 shown in FIG. 8 solves these problems, and provides an amplifier device for an ECM that can achieve a high input impedance and a low output impedance.

The amplifier device having a source follower structure 110 is a discrete (discrete semiconductor) device which includes a J-FET 120 and a bipolar transistor 130 integrated into one chip. One end of an ECM 115 and a gate of the J-FET 120 are connected to each other. One end (a source S, for example) of the J-FET 120 is connected to a base B of the bipolar transistor 130, and the other end (a drain D, for example) of the J-FET 120 is connected to a collector C of the bipolar transistor 130. The collector C of the bipolar transistor 130 is connected to a power supply VDD through a load resistor $R_L$. An emitter E of the bipolar transistor 130 is grounded.

The operation of the amplifier device having a source follower structure 110 is as follows.

When a power is supplied from the collector C of the bipolar transistor 130, a drain current IDS flows between the drain D and the source S of the J-FET 120. A capacitance change (voltage change) of the ECM 115 is applied to the gate G of the J-FET 120 as a gate voltage, and the drain current IDS flowing in the J-FET 120 is controlled in accordance with the amount of the capacitance change. When the drain current IDS according to the capacitance change flows from the source S of the J-FET 120 to the base B of the bipolar transistor 130, a current is supplied to the bipolar transistor 130, and is then amplified by a collector C—emitter E current amplification factor $\beta$ ($=\Delta I_C/\Delta I_B$=hFE). Thus amplified current is converted into a voltage by the load resistor $R_L$, and can be drawn from the collector C of the bipolar transistor 130 as an AC (alternating current) component of an output voltage Vout.

The J-FET 120 generally has a high input impedance, and hence a flow of an electric charge (current) according to a capacitance change in the ECM 115 can be drawn as a voltage change, even when the current is feeble.

In the amplifier device having a source follower structure 110 in FIG. 8, the voltage change in the ECM 115 is received by the J-FET 120, and a current output from a source follower is amplified by the bipolar transistor (npn transistor) 130.

With this configuration, since amplification can be performed by the bipolar transistor 130 having a current amplification factor hFE even when the J-FET 120 itself has a low transfer conductance gm, the input capacitance can be reduced and thereby an input loss can be reduced, by reducing the J-FET 120 in size.

However, the distortion characteristics of the amplifier device having a source follower structure 110 are deteriorated in some cases. The J-FET 120 is controlled in accordance with the difference between a gate potential $V_G$ and a source potential $V_S$ (a gate-source voltage $V_{GS}$). In an actual circuit, the gate potential $V_G$ is biased to 0 V with a DC (direct current) by a gate resistor $R_G$, and the source potential $V_S$ is higher by a base potential $V_B$ due to connection to the base B of the bipolar transistor (npn transistor 130). Hence, the gate-source voltage $V_{GS}=V_G-V_S$. Here, as described above, the source potential $V_S$ (=base potential $V_B$) is set on the basis of a forward-direction base-emitter voltage $V_{BE(f)}$ according to a base bias current.

In this event, when a pinch-off voltage $V_P$ of the J-FET 120 is smaller than the gate-source voltage $V_{GS}$, the amplifier device having a source follower structure 110 does not operate since the J-FET 120 is in an off state. Moreover, even when the pinch-off voltage $V_P$ is larger than the gate-source voltage $V_{GS}$, a deterioration in distortion characteristics and a decrease in controllability of a current consumption IDD may occur in some conditions.

Figure 9:
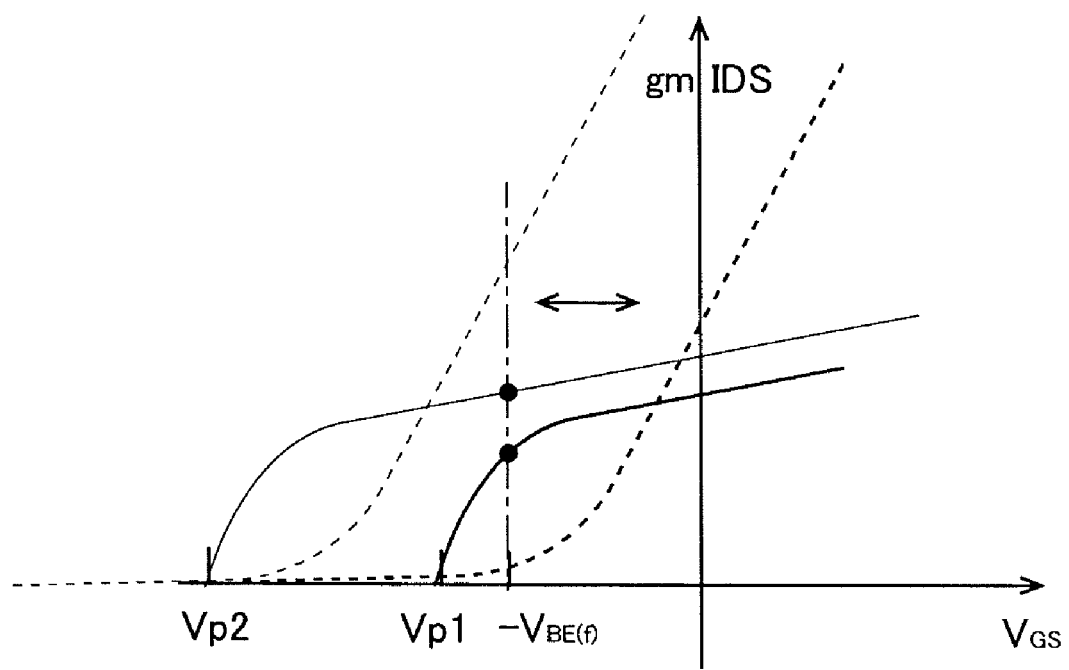
FIG. 9 is a characteristic graph illustrating characteristics of the amplifier device having a source follower structure.

FIG. 9 is a characteristic graph showing a relationship between the drain current IDS and the gate-source voltage $V_{GS}$ of the J-FET 120 (broken lines) and a relationship between the transfer conductance gm and the gate-source voltage $V_{GS}$ (gm-$V_{GS}$ characteristics, below; solid lines) of the J-FET 120. The vertical axis shows the drain current IDS and the transfer conductance gm, while the horizontal axis shows the gate-source voltage $V_{GS}$.

When the pinch-off voltage $V_p$ of the J-FET 120 is close to the gate-source voltage $V_{GS}$ ($V_P=V_{P1}$), a change in the transfer conductance gm relative to a change in the gate-source voltage $V_{GS}$ increases, and hence a distortion in an output current of the J-FET 120 increases. Moreover, since device variations in the pinch-off voltage $V_P$ cause variations in the transfer conductance gm to be prominent, a problem of an increase in variations in gain of the circuit arises. By contrast, when the pinch-off voltage $V_P$ of the J-FET 120 is sufficiently larger than the gate-source voltage $V_{GS}$ ($V_P=V_{P2}$), the above-described problem is solved. However, the drain current IDS becomes significantly larger in the gate-source voltage $V_{GS}=-V_{BE(f)}$ than the former case, and the drain current IDS is amplified by hFE by the bipolar transistor (npn transistor 130). Accordingly, a problem arises that the current consumption IDD of the amplifier device increases significantly.

Embodiments of the present invention solves these problems. Embodiments of the present invention will be described with reference to FIGS. 1, 2A, 2B, 3, 4A, 4B and 5 to 7.

Figure 1:
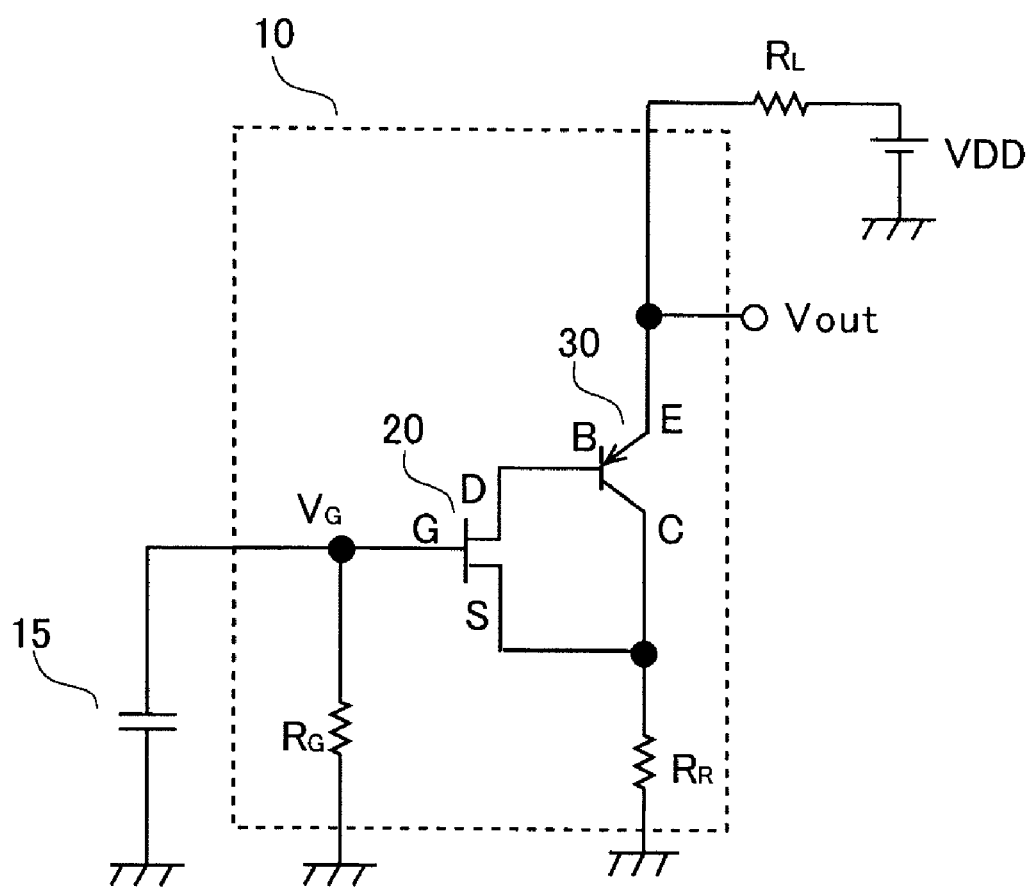
FIG. 1 is a circuit diagram illustrating an amplifier device of a first embodiment of the present invention.

Firstly, a first embodiment will be described with reference to FIG. 1. FIG. 1 is a circuit diagram showing an amplifier device 10 of the first embodiment.

The amplifier device 10 is an element which is connected between an electret condenser microphone (ECM) 15 and a load resistor $R_L$ and performs impedance conversion and amplification. The amplifier device 10 includes a junction field effect transistor (J-FET) 20, a bipolar transistor 30, a first resistor $R_G$ and a second resistor $R_R$.

The ECM 15 includes, in a case, a diaphragm and an electrode facing the diaphragm, and takes out vibration of the diaphragm by sound as a change in an electrostatic capacity between the diaphragm and the electrode. The diaphragm is made of a macromolecular material and the like, for example, and is caused to carry an electric charge by the electret effect.

The J-FET 20 is an n type J-FET having a transfer conductance gm, and includes an n type channel layer, a p type top gate layer, a p type back gate layer, an n type source region and an n type drain region. The bipolar transistor 30 is a pnp transistor having a current amplification factor hFE1.

In the amplifier device 10, a gate G of the J-FET 20 is connected to one end of the ECM 15 and one end of the first resistor $R_G$, and a drain D of the J-FET 20 is connected to a base B of the bipolar transistor 30.

The first resistor $R_G$ is a gate resistor of the J-FET 20, and is grounded at the other end. The resistance value of the first resistor $R_G$ is approximately 1 GΩ to 10 GΩ.

The resistance value of the load resistor $R_L$ is approximately 1 kΩ to 15 kΩ. The load resistor $R_L$ is connected, at one end, to a high-potential side of the bipolar transistor 30, and is connected, at the other end, to the power source VDD.

The source S of the J-FET 20 is connected to a collector C serving as a low-potential-side terminal of the bipolar transistor 30. The source S of the J-FET 20 and the collector C of the bipolar transistor 30 are connected to one end of the second resistor $R_R$. The second resistor $R_R$ is a feedback resistor, and has a resistance value of approximately 50Ω to 500Ω. The other end of the feedback resistor $R_R$ is grounded.

An emitter serving as the high-potential-side terminal of the bipolar transistor 30 is connected to an output terminal, and thereby an output voltage is drawn.

Operation of the amplifier device 10 is as follows.

A capacitance change (voltage change) in the ECM 15 is applied to the gate G of the J-FET 20 as an input voltage (gate-source voltage $V_{GS}$) change, and thereby a drain current IDS flowing in the J-FET 20 is controlled. The drain current IDS flowing into the drain D is supplied to the base B of the bipolar transistor 30, and is then amplified by the emitter E—collector C current amplification factor hFE1 of the bipolar transistor 30. A current resulting from the amplification (current consumption) IDD (≈IDS×hFE1) is converted into a voltage through the load resistor $R_L$, and is consequently drawn as an AC component of an output voltage Vout from the emitter E of the bipolar transistor 30.

The J-FET 20 has a high input impedance, and hence a flow of an electric charge (current) according to a capacitance change in the ECM 15 can be drawn as a voltage change even when the current is feeble.

In addition, in this embodiment, the size of the J-FET 20 is reduced, allowing an input capacitance Cin of the J-FET 20 to be sufficiently small.

Accordingly, an input loss at the J-FET 20 with respect to the capacitance change outputted from the ECM 15 can be significantly reduced.

Meanwhile, when the J-FET 20 is small in size, the problem of low gain arises. However, in this embodiment, the output current of the J-FET 20 can be amplified by the bipolar transistor 30. This means that the amplifier device 10 of this embodiment can have both a high input impedance of the J-FET 20 and a low output impedance of the bipolar transistor 30. Moreover, in terms of characteristics, the amplifier device 10 can achieve low noise, high gain and low distortion by using the low-noise J-FET 20 at the preceding stage while using the bipolar transistor 30, which has a high amplification factor and excellent amplification linearity, at the subsequent stage.

In this embodiment, when the output current of the J-FET 20 is amplified, the drain D of the J-FET 20 and the base B of the bipolar transistor 30 are connected to each other. This configuration enables an amplifier device which is easy to design and has excellent distortion characteristics and small variations in the current consumption IDD with respect to device variations, compared with the amplifier device having a source follower structure 110 (FIG. 8).

Figure 2A:
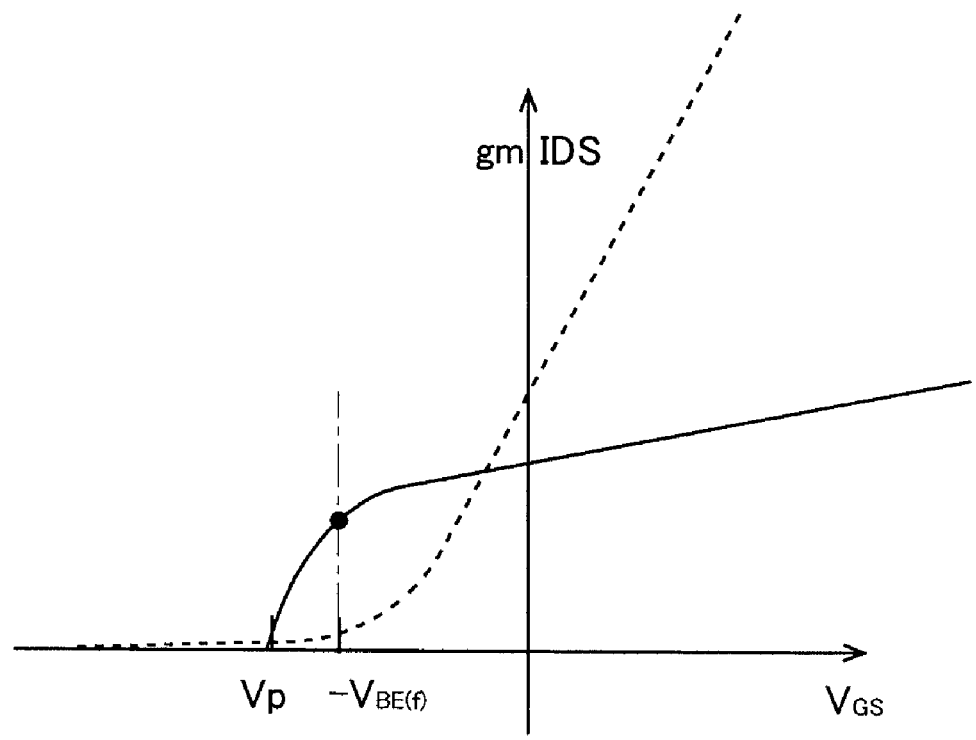
FIG. 2 is a characteristic graph illustrating the amplifier device of the first embodiment of the present invention.
Figure 2B:
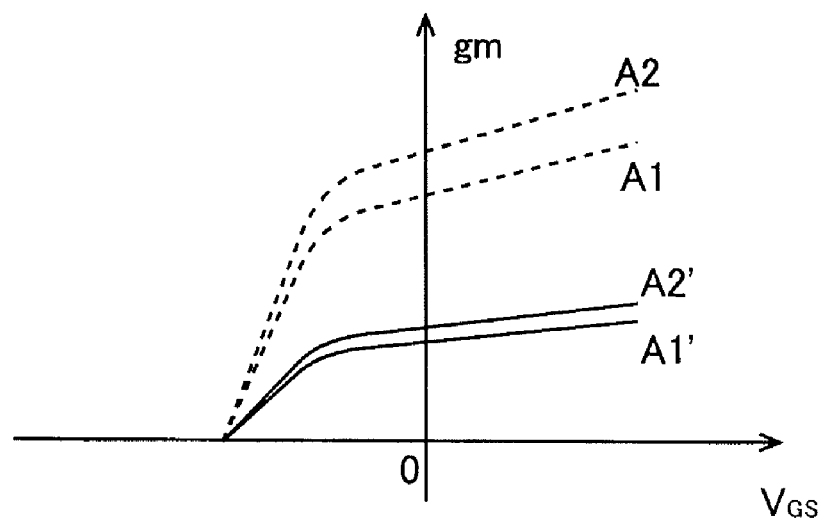

Description will be given with reference to FIGS. 2A and 2B. FIG. 2A is a graph illustrating characteristics of the amplifier device having a source follower structure and this embodiment. In FIG. 2A, a solid line shows gm-$V_{GS}$ characteristics, while a broken line shows characteristics between the drain current IDS and the gate-source voltage $V_{GS}$. In FIG. 2B, broken lines show gm-$V_{GS}$ characteristics of the amplifier devices having a source follower structure A1 and A2 (110) varying due to device variations, while solid lines show gm-$V_{GS}$ characteristics of amplifier devices A1' and A2' corresponding respectively to the amplifier devices A1 and A2 reduced in variations by this embodiment.

As shown in FIG. 2A, in the case of the amplifier device having a source follower structure (FIG. 8), the pinch-off voltage $V_P$ needs to be equal to or higher than the gate-source voltage $V_{GS} = -V_{BE(f)}$. However, if the pinch-off voltage $V_P$ is increased excessively, the drain current IDS of the J-FET 120 increases, and the current consumption of the amplifier device having a source follower structure 110 amplified by hFE also increases. For this reason, the pinch-off voltage $V_P$ is designed to be $-(V_{BE(f)} + \Delta V)[\Delta V = 0.2$ V to $0.3$ V$]$, approximately. Here, since the transfer conductance gm also changes significantly along with a change in the gate-source voltage $V_{GS}$, distortion in the output current of the J-FET 120 increases. Furthermore, since variations in the transfer conductance gm becomes prominent due to device variations in the pinch-off voltage $V_P$, another problem of an increase in variations in gain of the circuit arises. Here, the magnitude of the pinch-off voltage $V_P$ is expressed in relation to the absolute value.

In this embodiment, however, the source follower structure is not employed, and hence the gate-source voltage $V_{GS} = 0$ V is the operating point. Since the device design of the J-FET 20 can be performed with respect to 0V, variations in the transfer conductance gm are small, and a device having a small drain current IDSS at the time of receiving no input can be relatively easily designed. Accordingly, distortion as an amplifier device can be reduced.

Moreover, since the input voltage does not shift, the J-FET 20 can be allowed to operate within a region of small variations in the transfer conductance gm even when the pinch-off voltage $V_P$ varies due to device variations. Thus, variations in gain due to device variations can be reduced Further, in this embodiment, the source S of the J-FET 20 and the collector C of the bipolar transistor 30 are connected to the feedback resistor $R_R$. Along with an increase in the current consumption IDD of the amplifier device, the source potential of the J-FET 20 increases by the formula of $V_S = R_R \times$ IDD by the feedback resistor $R_R$, and thereby, the input voltage (gate-source voltage VGS) of the J-FET 20 relatively decreases. Accordingly, feedback can be provided to the entire amplifier device.

Hence, as shown in FIG. 2B, while the transfer conductance gm in the gm-$V_{GS}$ characteristics of the amplifier device 10 is reduced, variations in the transfer conductance gm can be reduced and device variations (between the amplifier devices A1 and A2) can be reduced. Thereby, the amplifier device 10 can achieve stabilization in gain and the current consumption IDD and expansion of a stable frequency range.

In addition, although gain is determined by the transfer conductance gm of the J-FET and the current amplification factor hFE of the bipolar transistor in the amplifier device having a source follower structure 110, the ratio between the feedback resistor $R_R$ and the load resistor $R_L$ is dominant in gain design and device variations can be smoothed out in this embodiment.

The gain of the amplifier device of this embodiment is calculated by the following formula in an ideal condition where an influence of the capacitance is eliminated.

$$\text{Gain} = R_L / (R_R \cdot (1 + 1/(R_R(1+hFE1) \cdot gm)))$$

In this case, when $R_R(1+hFE1) \cdot gm \gg 1$, an approximation can be made with $R_L/R_R$. Here, assume that gm=1 mS, $R_R$=approximately 100Ω, and the current amplification factor hFE1 of the bipolar transistor 30 is 50. Then, $R_R(1+hFE1) \cdot gm \approx 5 > 1$, and the feedback resistor $R_R$ and the load resistor $R_L$ are dominant in gain design.

Thus, by optimally adjusting the feedback resistor $R_R$ with respect to the external load resistor $R_L$, desired gain can be obtained.

Figure 3:
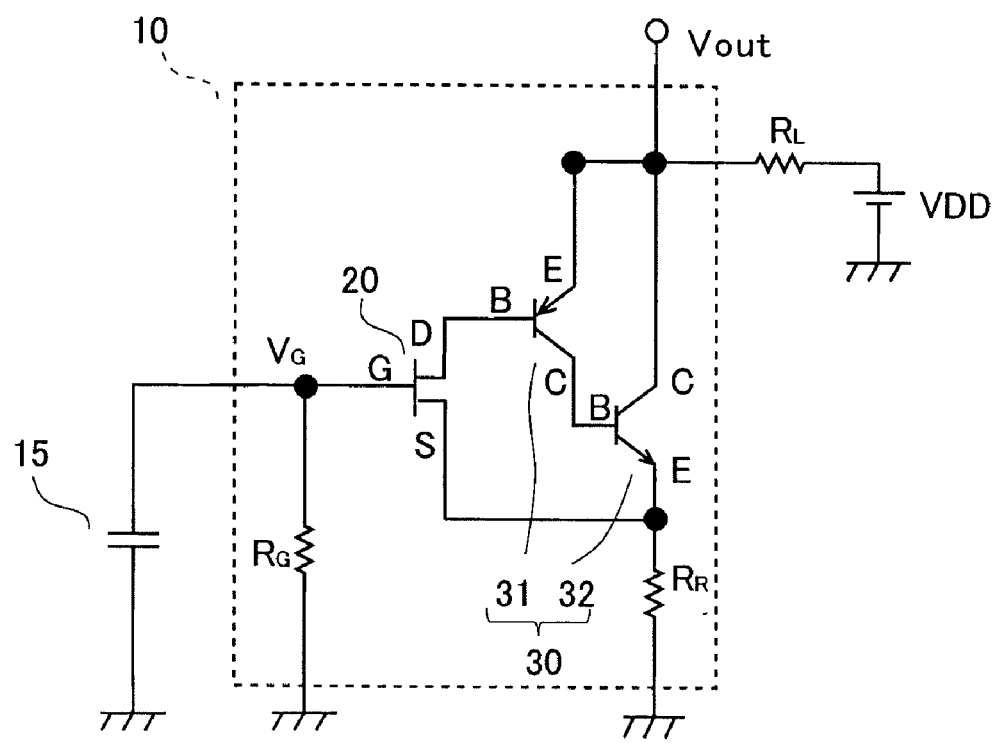
FIG. 3 is a circuit diagram illustrating an amplifier device of a second embodiment of the present invention.

FIG. 3 is a circuit diagram showing an amplifier device 10 of a second embodiment.

A bipolar transistor 30 may have such a configuration that two bipolar transistors are connected between one end of a load resistor $R_L$ and one end of a feedback resistor $R_R$ by the Darlington connection. In this case, a pnp transistor 31 having a current amplification factor hFE1 is used at the preceding stage, and an npn transistor 32 having a current amplification factor hFE2 is used at the subsequent stage. A base B of the pnp transistor 31 is connected to a drain D of the J-FET 20, and an emitter E of the npn transistor 32 is connected to the one end of the feedback resistor $R_R$.

A collector C of the pnp transistor 31 and a base B of the npn transistor 32 are connected, an emitter E of the pnp transistor 31 and a collector C of the npn transistor 32 are connected to the one end of the load resistor $R_L$, and the emitter E of the npn transistor 32 is connected to a source S of the J-FET 20.

Since this circuit configuration does not employ the source follower structure as described above, a gate-source voltage $V_{GS} = 0$ V is the operating point. Since the device design of the J-FET 20 can be performed based on 0 V, variations in a transfer conductance gm are small, and a device having a small drain current IDSS at the time of receiving no input can be relatively easily designed. Accordingly, distortion as an amplifier device can be reduced.

Moreover, in the second embodiment, the pnp transistor 31 having the current amplification factor hFE1 and the npn transistor 32 having the current amplification factor hFE2 are connected by the Darlington connection. With this configuration, a current amplification factor hFE ($\approx$ hFE1×hFE2) of the two bipolar transistors can be increased.

For example, assume that the current amplification factor hFE is 5000 when the two transistors 31 and 32 are connected by the Darlington connection, the transfer conductance gm of the J-FET 20 is 1 mS, and design is made with $R_R$=100Ω. In this case, $R_R(1+hFE) \cdot gm = 500 \gg 1$ by the above gain calculation formula. Thus, some variations in the transfer conductance gm and the current amplification factor hFE seem to rarely affect gain.

Figure 4A:
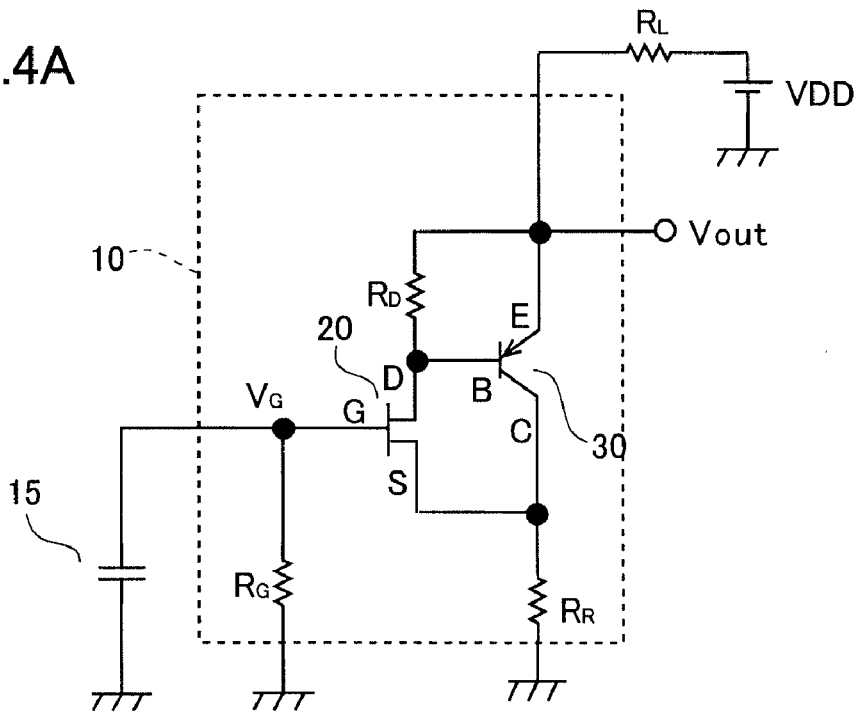
FIG. 4 is a circuit diagram illustrating an amplifier device of a third embodiment of the present invention.
Figure 4B:
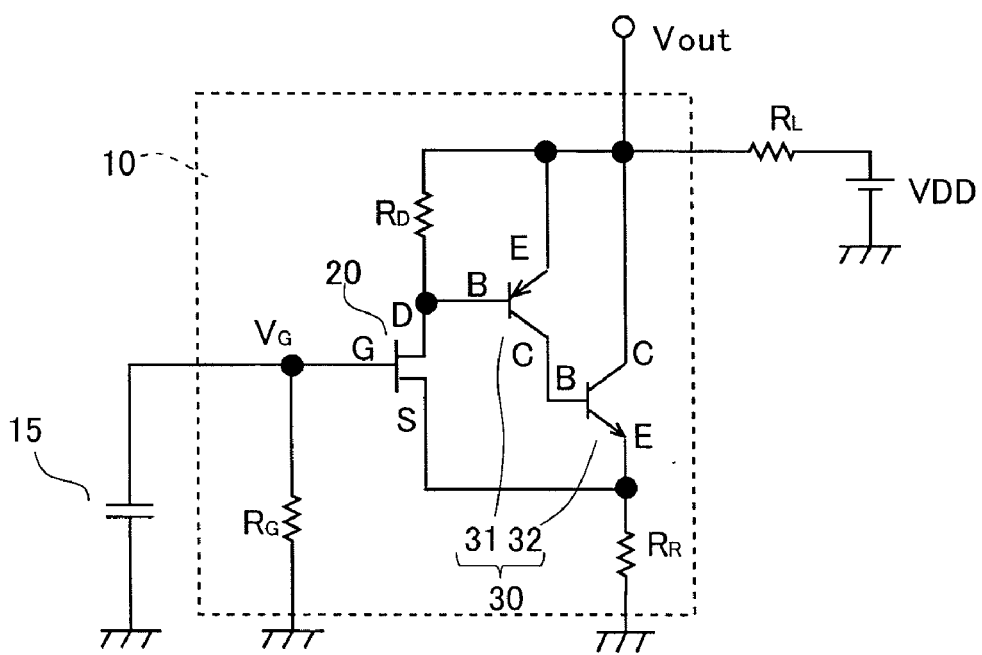

FIGS. 4A and 4B are circuit diagrams showing an amplifier device 10 of a third embodiment. In the third embodiment, a third resistor $R_D$ is connected between a drain D of a J-FET 20 and a high-potential side of a bipolar transistor 30. FIG. 4A is a circuit diagram when the third resistor $R_D$ is connected to the circuit of the first embodiment, and FIG. 4B is a circuit diagram when the third resistor $R_D$ is connected to the circuit of the second embodiment.

The third resistor $R_D$ is a bias resistor which controls an output current (current consumption) IDD, and the resistance value of the third resistor $R_D$ is approximately 10 kΩ to 100 kΩ. This resistor also functions as a feedback resistor. Thereby, in the case of FIG. 4A, the output current (current consumption) IDD can be adjusted by providing a feedback to the pnp transistor 30. In the case of FIG. 4B, the output current (current consumption) IDD can be adjusted by providing a feedback to the pnp transistor 31 in the bipolar transistor 30 connected by the Darlington connection. Here, influence of the bias resistor $R_D$ on gain is small.

Figure 5:
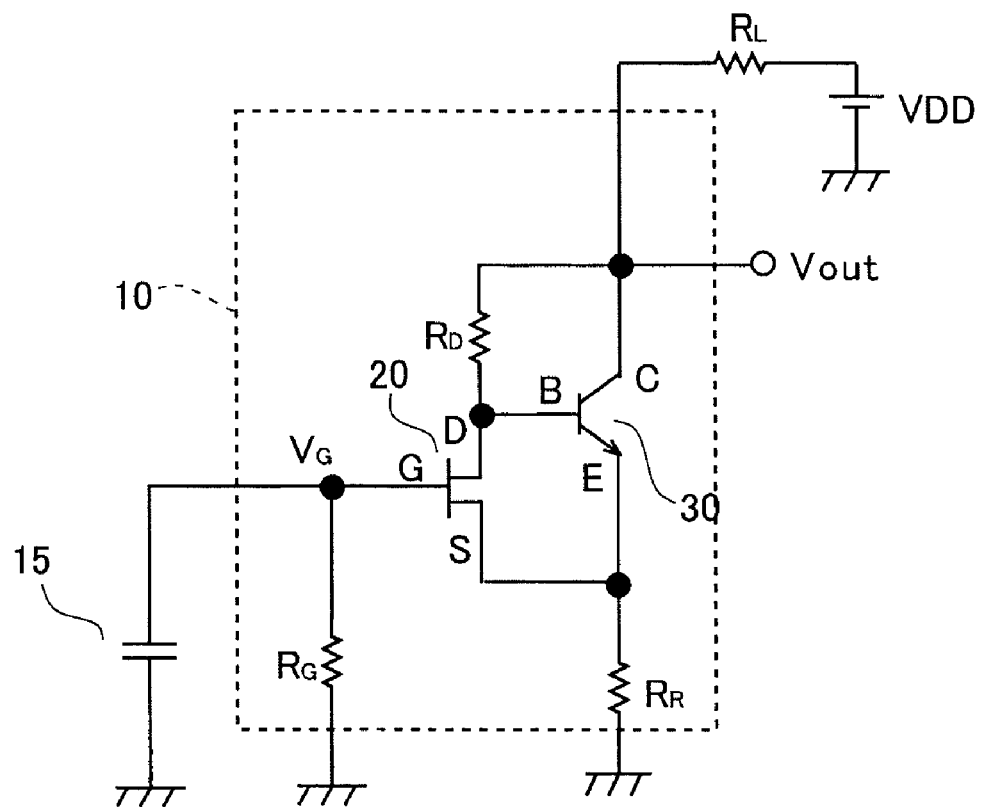
FIG. 5 is a circuit diagram illustrating an amplifier device of a fourth embodiment of the present invention.

FIG. 5 is a circuit diagram of an amplifier device 10 of a fourth embodiment. In the fourth embodiment, the pnp transistor of the bipolar transistor 30 in the circuit in FIG. 4A is replaced with an npn transistor, and a third resistor $R_D$ is connected between a drain D of a J-FET 20 and a high-potential side of a bipolar transistor 30. Since the configuration except this respect is the same as that of FIG. 4A, description thereof is omitted here.

By adding the bias resistor $R_D$, an npn transistor alone can be used for the bipolar transistor 30. Since an integrated circuit process of an npn transistor is easier than that of a pnp transistor, the cost for the integrated circuit process can be cut down.

Figure 6:
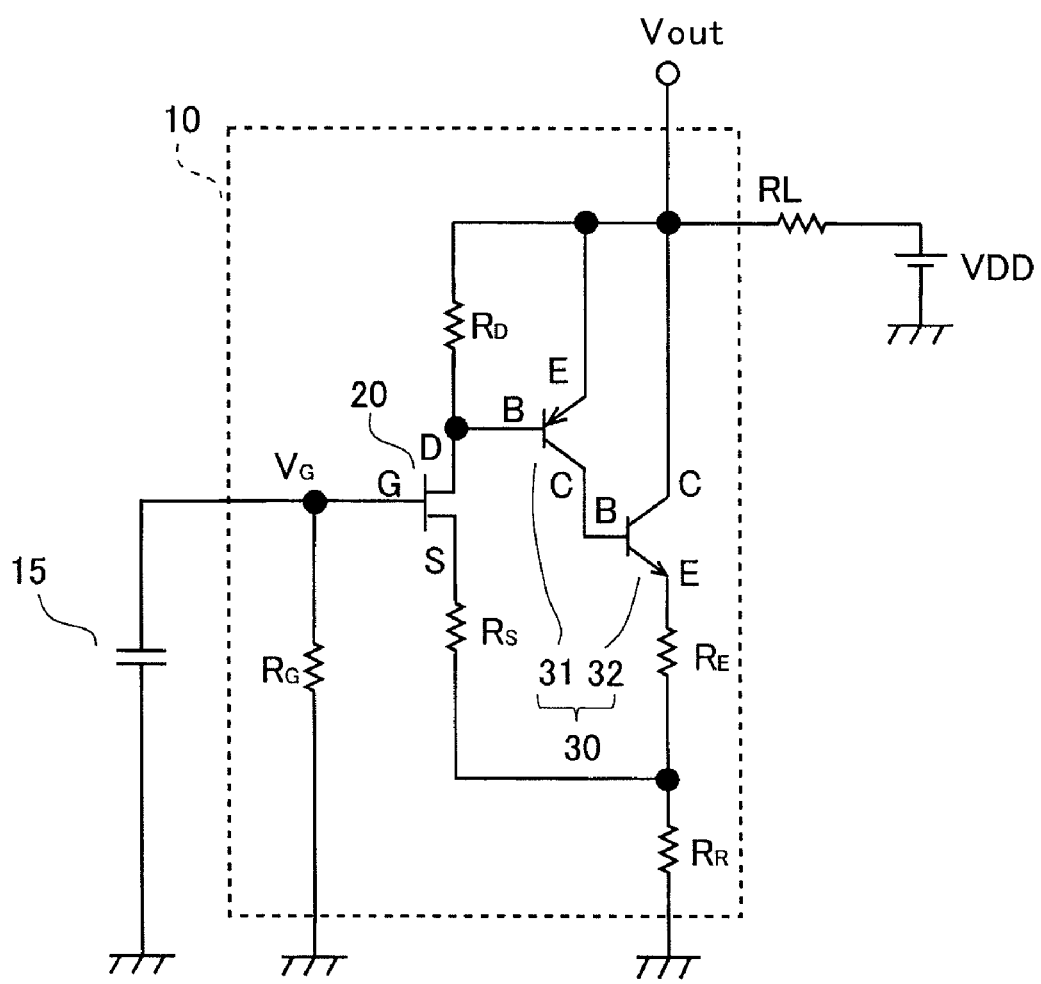
FIG. 6 is a circuit diagram illustrating an amplifier device of a fifth embodiment of the present invention.

FIG. 6 is a circuit diagram showing an amplifier device 10 of a fifth embodiment. In the fifth embodiment, resistors are connected respectively to a J-FET 20 and a bipolar transistor 30 in series.

Here, a case in which resistors are connected to the amplifier device 10 shown in the second embodiment and having transistors connected by the Darlington connection is shown as an example. Specifically, a fourth resistor $R_s$ having a resistance value of approximately 100Ω to 100 kΩ is connected to a source S of the J-FET 20. Moreover, a fifth resistor $R_E$ having a resistance value of approximately 50Ω to 200Ω is connected to an emitter E of an npn transistor 32 at the subsequent stage in the Darlington connection. The fourth resistor $R_S$ and the fifth resistor $R_E$ respectively provide, as feedback resistors, feedbacks to the J-FET 20 and the bipolar transistor 30. Since an input voltage (gate-source voltage $V_{GS}$) of the J-FET 20 relatively decreases by connecting the feedback resistor $R_S$ to the source S of the J-FET 20, an output of the J-FET 20 can be stabilized. In addition, by connecting the feedback resistor $R_E$ to the bipolar transistor 30 (the emitter E of the npn transistor 32 at the subsequent stage), an output of the bipolar transistor 30 can be stabilized.

A feedback resistor $R_R$ is connected to the entire amplifier device 10. However, a change in a transfer conductance gm (current amplification factor hFE) and device variations in the transfer conductance gm (current amplification factor hFE) can be reduced by providing a feedback at an output end of each of the J-FET 20 and the bipolar transistor 30 as in this embodiment, while the transfer conductance gm (current amplification factor hFE) of each of the devices is reduced. Accordingly, even when distortion characteristics cannot be sufficiently improved only by the feedback resistor $R_R$, excellent distortion characteristics are obtained, and the outputs can be stabilized.

Although an example in which the feedback resistor $R_S$ is connected to the J-FET 20 and the feedback resistor $R_E$ is connected to the bipolar transistor 30 is shown in FIG. 6 as an example, a feedback resistor may be connected to only one of the J-FET 20 and the bipolar transistor 30. Moreover, the bipolar transistor 30 is not limited to transistors connected by the Darlington connection, and may be configured only by an npn transistor shown in FIG. 5. Furthermore, when the preceding stage of the bipolar transistor 30 is a pnp transistor, the bias resistor $R_D$ connected to the drain D of the J-FET 20 may be omitted.

Figure 7:
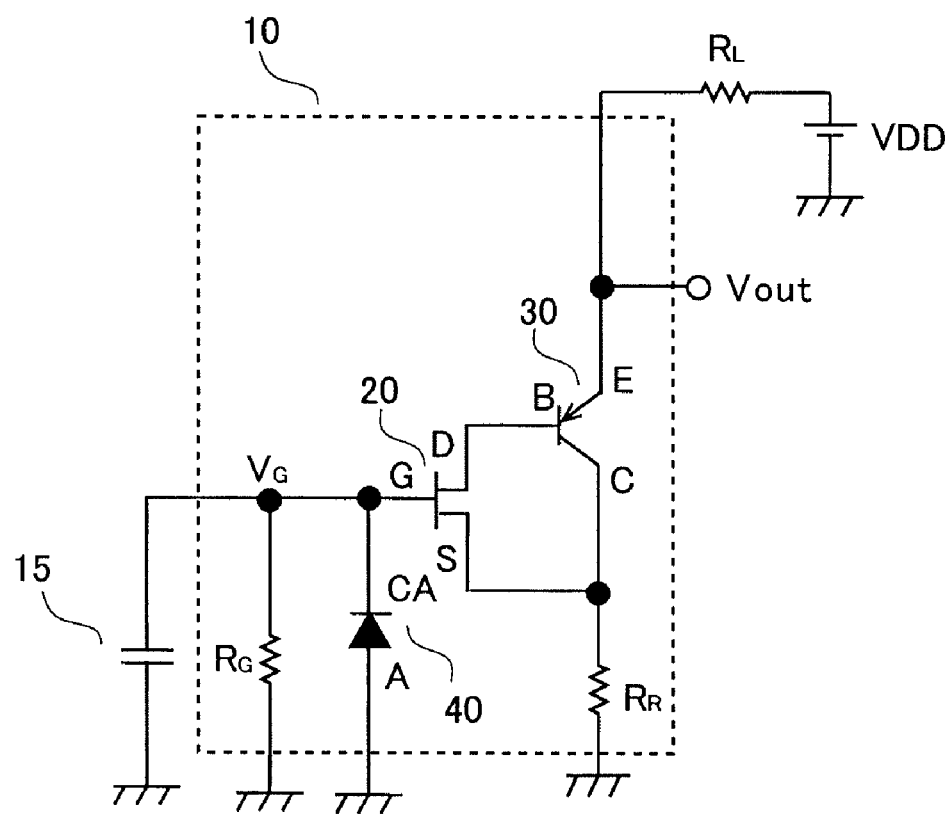
FIG. 7 is a circuit diagram illustrating an amplifier device of a sixth embodiment of the present invention.

FIG. 7 is a circuit diagram showing an amplifier device 10 of a sixth embodiment. In the sixth embodiment, a cathode CA of a diode 40 is connected to the gate G of the J-FET 20 of the first embodiment, and an anode A of the diode 40 is grounded. The configuration except this respect is the same as that of the first embodiment, and hence description thereof is omitted here.

In this configuration, if a gate potential $V_G$ becomes a negative potential due to noise from the outside in forward bias, clipping occurs at a forward voltage $V_F$ of the diode 40. Moreover, in reverse bias, electrostatic breakdown withstand from the outside can be increased. Although a case in which the diode 40 is connected to the first embodiment is shown in FIG. 7, a configuration in which the diode 40 is connected to any of the second to fifth embodiments may be employed.

According to these embodiments, firstly, an amplifier device is configured by integrating a J-FET and a bipolar transistor and by connecting a drain of the J-FET to a base of the bipolar transistor. Thereby, the gate-source voltage $V_{GS}$ does not shift due to the source follower structure, and hence device design of the J-FET can be facilitated.

Moreover, since the gate-source voltage $V_{GS}$ does not shift, variations in gain due to device variations are reduced, and yields can be improved.

Secondly, a load resistor $R_R$ is added to a low-potential side of the bipolar transistor. Thereby, variations in gain of the amplifier device can be reduced by providing negative feedbacks to both of the J-FET and the bipolar transistor, and outputs can be stabilized. This improves distortion characteristics. Moreover, by designing open loop gain of the circuit to be large, the ratio between a load resistor $R_L$, externally connected to a high-potential side of the bipolar transistor, and the feedback resistor $R_R$, connected to the low-potential side, becomes dominant in gain design. Accordingly, there is an advantage that device variations can be smoothed out. Hence, expansion in series is possible by preparing a broad gain line-up.

Thirdly, the open loop gain of the circuit is increased by configuring the bipolar transistor by a preceding-stage pnp transistor and a subsequent-stage npn transistor connected by the Darlington connection. Thereby, gain of the amplifier device can be stabilized.

Fourthly, by connecting a bias resistor $R_D$ between the drain of the J-FET and the high-potential side of the bipolar transistor, a current consumption IDD of the amplifier device is determined by bias adjustment of the bipolar transistor and distortion characteristics can be improved by providing a negative feedback. Since an npn transistor alone can be used for the bipolar transistor by adding the bias resistor $R_D$, the cost of an integrated circuit process can be cut down.

Fifthly, by connecting a feedback resistor $R_s$ to a source side of the J-FET, an output of the J-FET itself can be stabilized. Moreover, by connecting a feedback resistor $R_E$ to the low-potential side of the bipolar transistor itself (npn transistor itself), an output of the bipolar transistor itself (npn transistor itself) can be stabilized.

Although the circuit can be stabilized by providing a feedback to an output of the entire amplifier device by the feedback resistor $R_R$, the output can be further stabilized and low distortion can be achieved by adding each of the above-described bias resistor $R_D$, feedback resistor $R_S$ and feedback resistor $R_E$.

What is claimed is:

1. An amplifier device connected between an electret condenser microphone and a load resistor, the amplifier device comprising:
    a junction field effect transistor comprising a gate, a source and a drain;
    a bipolar transistor comprising a base, a high-potential side terminal and a low-potential side terminal;
    a first resistor comprising a first terminal and a second terminal; and
    a second resistor comprising a third terminal and a fourth terminal,
    wherein the gate is connected to a terminal of the electret condenser microphone and the first terminal, the drain is connected to the base, the high-potential side terminal is connected to a terminal of the load resistor, the second terminal is grounded, the source and the low-potential side terminal are connected to the third terminal, the fourth terminal is grounded, and an output voltage is drawn between the high-potential side terminal and the terminal of the load resistor.

2. The amplifier device of claim 1, wherein the bipolar transistor comprises a pnp transistor.

3. The amplifier device of claim 1, wherein the bipolar transistor comprises a pnp transistor and an npn transistor connected to each other by Darlington connection, a base of the pnp transistor is connected to the drain, an emitter of the pnp transistor and a collector of the npn transistor are connected to the terminal of the load resistor, a collector of the pnp transistor is connected to a base of the npn transistor, and an emitter of the npn transistor is connected to the third terminal.

4. The amplifier device of claim 2, further comprising a third resistor connected between the high-potential side terminal and the drain.

5. The amplifier device of claim 3, further comprising a third resistor connected between the high-potential side terminal and the drain.

6. The amplifier of claim 1, wherein the bipolar transistor is an npn transistor, and a third resistor is connected between the high-potential side terminal and the drain.

7. The amplifier device of claim 6, further comprising a fourth resistor connected between the source and the third terminal.

8. The amplifier device of claim 7, further comprising a fifth resistor connected between the low-potential side terminal and the third terminal.

9. The amplifier device of claim 1, further comprising a first additional resistor connected between the source and the third terminal and a second additional resistor connected between the low-potential side terminal and the third terminal.

10. The amplifier device of claim 1, further comprising a diode comprising a cathode connected to the gate and an anode that is grounded.

11. The amplifier device of claim 1, wherein the high-potential side terminal is an emitter of the bipolar transistor and the low-potential side terminal is a collector of the bipolar transistor.

* * * * *